(12) United States Patent
Meyer et al.

(10) Patent No.: US 9,139,931 B2
(45) Date of Patent: Sep. 22, 2015

(54) DIRECTIONAL SOLIDIFICATION FURNACE HEAT EXCHANGER

(75) Inventors: Benjamin Michael Meyer, Defiance, MO (US); Lee William Ferry, St. Charles, MO (US)

(73) Assignee: MEMC Singapore Pte. Ltd., Singapore (SG)

( * ) Notice: Subject to any disclaimer, the term of this patent is extended or adjusted under 35 U.S.C. 154(b) by 1121 days.

(21) Appl. No.: 13/105,003

(22) Filed: May 11, 2011

(65) Prior Publication Data

US 2012/0285201 A1   Nov. 15, 2012

(51) Int. Cl.
| | |
|---|---|
| C30B 11/00 | (2006.01) |
| F27B 5/06 | (2006.01) |
| F27D 17/00 | (2006.01) |
| C30B 35/00 | (2006.01) |

(52) U.S. Cl.
CPC ............... *C30B 11/003* (2013.01); *F27B 5/06* (2013.01); *F27D 17/004* (2013.01); *C30B 35/00* (2013.01)

(58) Field of Classification Search
None
See application file for complete search history.

(56) References Cited

U.S. PATENT DOCUMENTS

| | | | |
|---|---|---|---|
| 4,202,400 A | 5/1980 | Gigliotti, Jr. et al. | |
| 4,412,577 A | 11/1983 | Salkeld et al. | |
| 5,070,936 A * | 12/1991 | Carroll et al. | 165/80.4 |
| 6,027,563 A * | 2/2000 | Choudhury et al. | 117/18 |
| 7,344,596 B2 * | 3/2008 | Schmid et al. | 117/206 |
| 7,753,108 B2 * | 7/2010 | Lai et al. | 165/80.4 |
| 2003/0151130 A1 | 8/2003 | Cheon | |
| 2008/0257517 A1 | 10/2008 | Elliott et al. | |
| 2011/0259262 A1 * | 10/2011 | Khattak et al. | 117/81 |
| 2012/0063085 A1 * | 3/2012 | Dede | 361/692 |
| 2012/0119407 A1 * | 5/2012 | Nichol et al. | 264/104 |

FOREIGN PATENT DOCUMENTS

| | | | |
|---|---|---|---|
| JP | 57096557 A | | 6/1982 |
| WO | WO 2013019401 A1 * | | 2/2013 |

OTHER PUBLICATIONS

PCT International Search Report and Written Opinion of the International Searching Authority mailed on Jul. 5, 2012 regarding PCT/US2012/036288; 10 pages.

* cited by examiner

*Primary Examiner* — Anita Alanko
(74) *Attorney, Agent, or Firm* — Armstrong Teasdale LLP

(57) ABSTRACT

A heat exchanger system for use in a directional solidification furnace is disclosed. The heat exchanger includes a plate having a flow path formed in the plate for directing a flow of coolant. The flow path has an inlet positioned adjacent an outlet. A wall separates the inlet and the outlet of the flow path. The heat exchanger includes a cover having an opening in fluid communication with the inlet and the outlet of the flow path. An inner conduit is connected to the inlet of the flow path and an outer conduit is connected to the outlet of the flow path.

17 Claims, 12 Drawing Sheets

DIRECTIONAL SOLIDIFICATION FURNACE HEAT EXCHANGER

FIELD

This disclosure relates generally to heat exchangers and, more specifically, to heat exchangers used in directional solidification furnaces.

BACKGROUND

Directional solidification furnaces are used, for example, to produce multi-crystalline silicon ingots. The furnace has a crucible into which raw silicon is placed. The crucible is supported by a structure that adds structural rigidity to the crucible. The crucible is disposed within a containment vessel that forms part of the furnace and seals the crucible from the ambient environment.

During use, the raw silicon is melted and then cooled at a controlled rate to achieve directional solidification within the resulting ingot. The controlled rate of cooling is established by any combination of reducing the amount of heat applied by the heaters, movement of or opening of a heat vent in insulation surrounding the crucible, and/or the circulation of a cooling medium through a heat exchanger disposed adjacent the crucible and/or the crucible support. The ingot solidifies in the region closest to the cooler side of the crucible and proceeds in a direction away from the cooler side of the crucible.

The efficiency and complexity of heat exchangers used to transmit heat away from the crucible during solidification of the ingot is a concern. As the size of crucibles has increased, the size and complexity of heat exchangers has increased as well. There exists a need for a more efficient and less complex heat exchanger for use in directional solidification furnaces.

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

SUMMARY

In one aspect, a furnace for melting silicon is disclosed. The furnace comprises a containment vessel, a crucible, and a heat exchanger. The crucible is positioned within the containment vessel and is configured for holding molten silicon and has a lower surface. The heat exchanger is for transferring heat away from the crucible and comprises a plate having a surface for positioning proximate the lower surface of the crucible, a flow path formed in the plate for directing a flow of coolant and having an inlet positioned adjacent an outlet, a wall separating the inlet and the outlet of the flow path, a cover having an opening in fluid communication with the inlet and the outlet of the flow path, an inner conduit in fluid communication with the inlet of the flow path, and an outer conduit in fluid communication with the outlet of the flow path. The outer conduit is concentric with the inner conduit and at least a portion of the inner conduit is disposed within the outer conduit.

In another aspect, a heat exchanger system is disclosed. The system comprises a plate, a wall, a cover, an inner conduit, and a connector. The plate has a flow path formed in the plate for directing a flow of coolant and also has an inlet positioned adjacent an outlet. The wall separates the inlet and the outlet of the flow path. The cover has an opening in fluid communication with the inlet and the outlet of the flow path. The inner conduit is connected to the inlet of the flow path. The connector is connected the outlet of the flow path.

In yet another aspect, a heat transfer plate is disclosed. The heat transfer plate comprises a surface for positioning adjacent a heat source, a flow path for coolant formed adjacent the surface having an inlet adjacent an outlet, a wall separating the inlet and the outlet of the flow path, and a cover having an opening in fluid communication with the inlet and the outlet of the flow path.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION OF THE INVENTION

Figure 1:
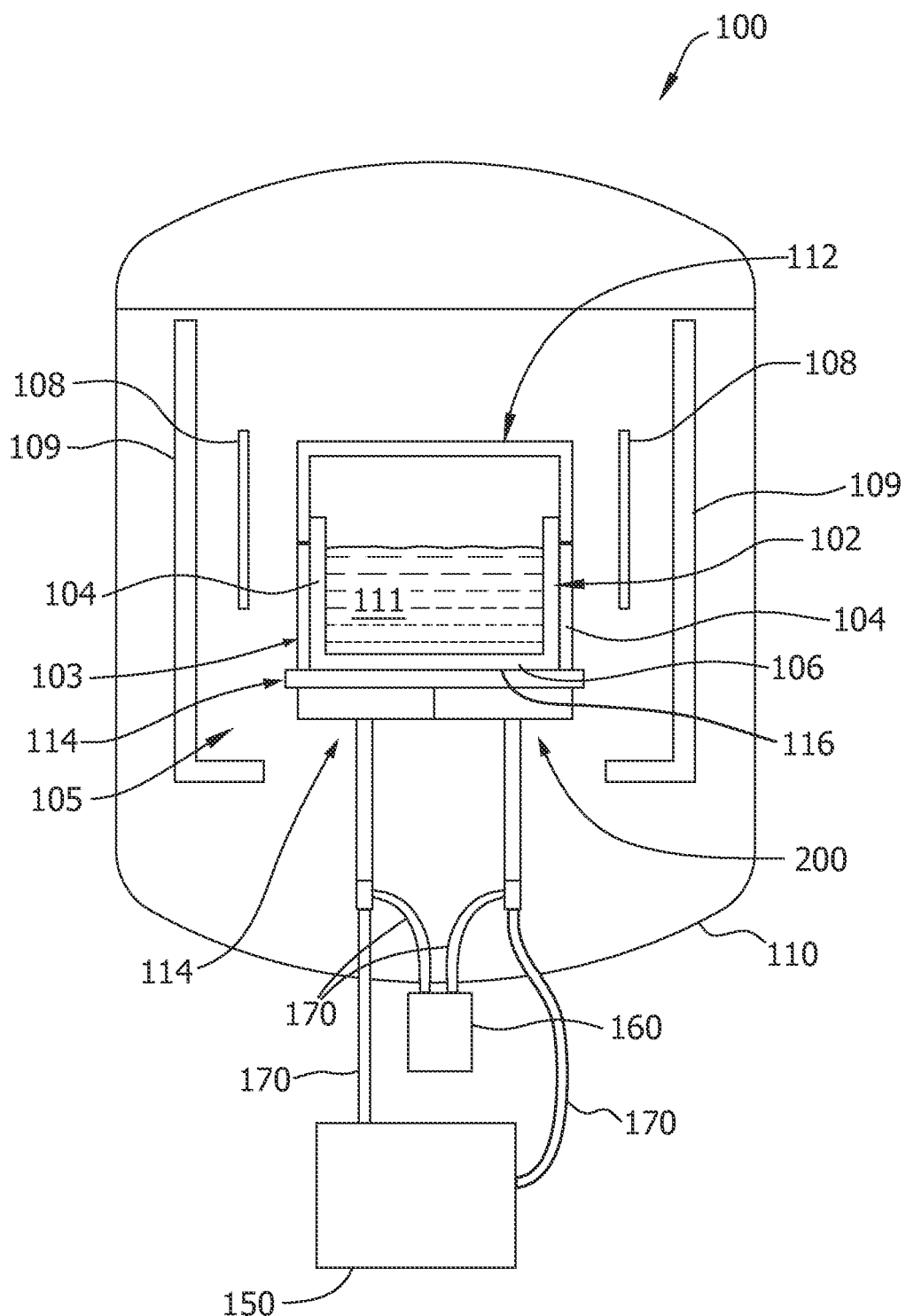
FIG. 1 is a schematic cross-sectional view of an example directional solidification furnace and heat exchangers.

Referring to the drawings, an exemplary directional solidification furnace is shown in FIG. 1 and indicated generally at 100. The furnace 100 is of the type used to melt silicon and produce a multi-crystalline silicon ingot. Such an ingot may be manufacture photovoltaic devices, among other possible uses.

The directional solidification furnace 100 of FIG. 1 comprises a crucible 102 having a base 106. The crucible 102 and the base 106 are supported by a crucible support 103 having support walls 104 that add structural rigidity to the crucible. The crucible 102 is typically constructed of quartz, or another suitable material that can withstand high temperatures while remaining essentially inert. The crucible 102 is surrounded by a containment vessel 110. Side insulation 109 is disposed around the crucible and may optionally be movable away from the crucible.

Together with a lid 112, the crucible 102 and crucible support 103 form an inner assembly 105 of the furnace 100. Heaters 108 are positioned around the walls 104 and within the containment vessel 110. The heaters 108 may suitably be radiant heaters configured to apply the heat necessary to melt charge material within the crucible. The charge material of this embodiment is silicon, though other materials are contemplated.

A bottom 114 of the crucible support 103 may be positioned on a support (not shown) in some embodiments. A heat exchanger, indicated generally at 200 and discussed in greater detail below, is positioned adjacent the bottom 114 of the crucible support 103 and proximate a lower surface 116 of the base 106 of the crucible 102. Two heat exchangers 200 are shown in the cross-sectional schematic of FIG. 1 and two additional similarly sized and configured heat exchangers are hidden in FIG. 1. Any number of heat exchangers 200 may be used without departing from the scope of the embodiments. The subsequent Figures depict a single heat exchanger 200 for the sake of clarity.

In operation, the containment vessel 110 is opened and the crucible 102 is charged with pieces of poly-crystalline silicon (e.g., chunks, dust, etc.). The lid 112 of the crucible 102 and the containment vessel 110 are then closed and the heaters 108 are used to melt the silicon. After the silicon has melted, the heaters 108 cease operation and the silicon melt begins to solidify into an ingot. Vents (not shown) in the insulation 109 may be opened and/or the insulation may be moved to permit heat to dissipate away from the inner assembly 105.

The heat exchanger 200 is used to transfer heat from the crucible 102 (and the melt contained therein) to a liquid coolant flowing through the heat exchanger. The heat exchanger 200 is supplied with "fresh" coolant from a source tank (indicated schematically at 150 in FIG. 1). After flowing through the heat exchanger 200 the coolant is referred to as "spent" coolant and flows to a receiving tank (indicated schematically at 160 in FIG. 1). The spent coolant may then be cooled (e.g., by a refrigeration or heat dissipation system) and flow back to the source tank 150. The now fresh coolant can then flow again through the heat exchanger (i.e., be recycled). In other embodiments, the spent coolant may be disposed of and not reused after flowing to the receiving tank.

Figure 2:
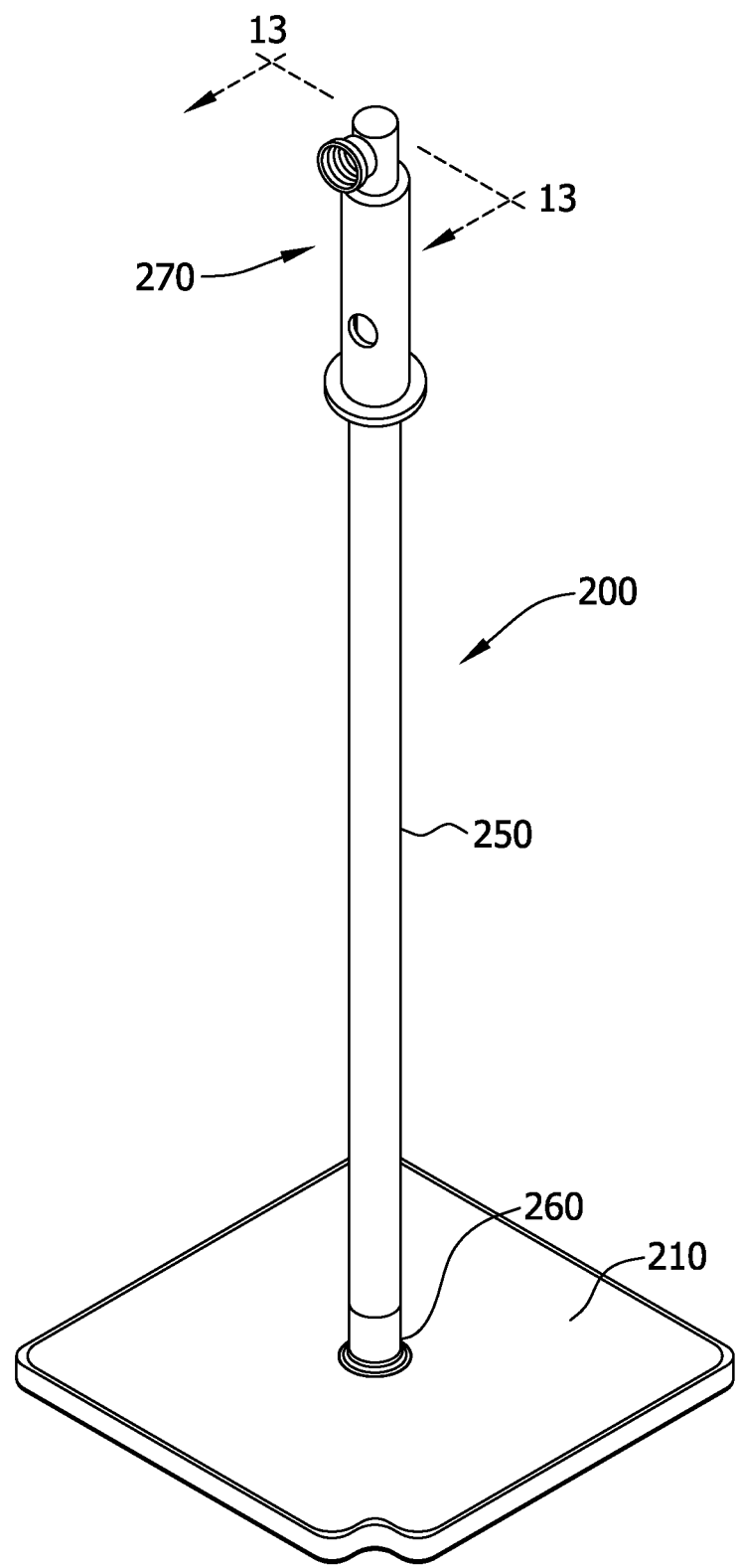
FIG. 2 is a perspective view of one of the heat exchangers of FIG. 1.
Figure 3:
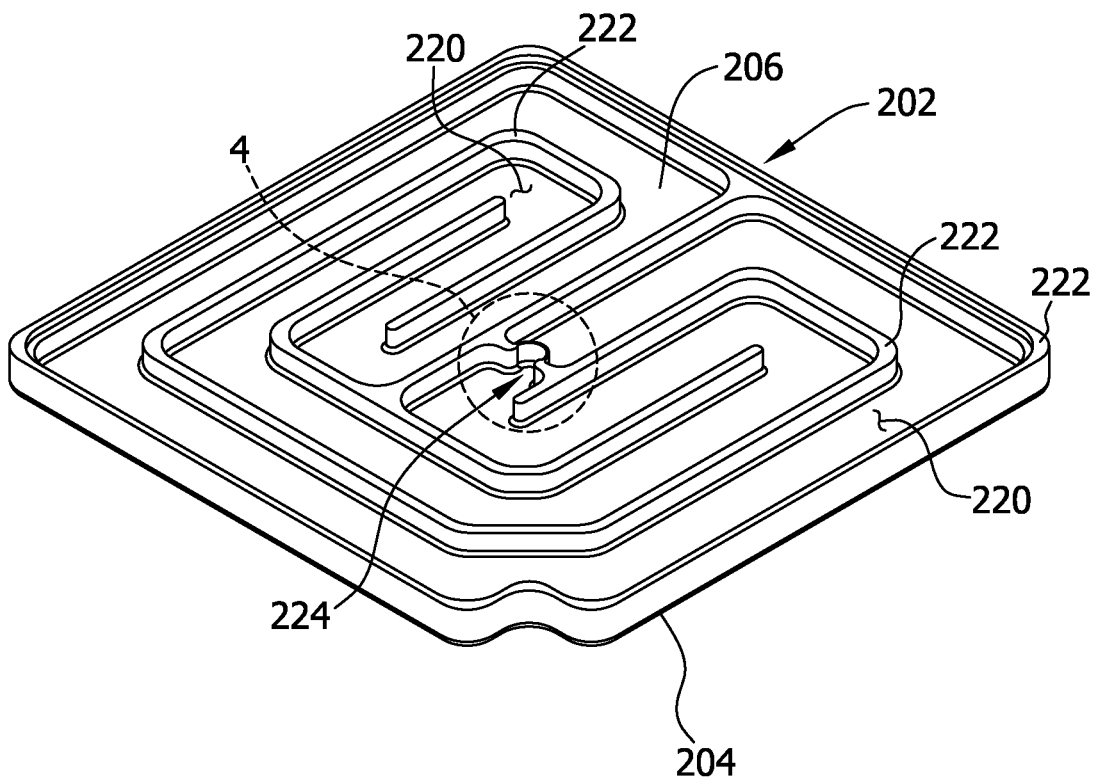
FIG. 3 is a perspective view of a plate used in the heat exchanger of FIG. 2.
Figure 4:
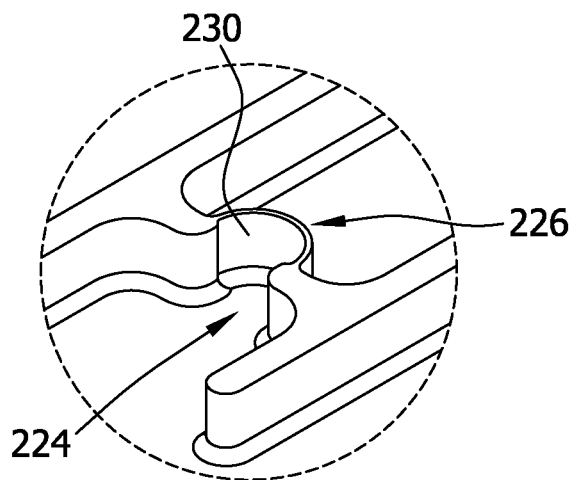
FIG. 4 is an enlarged portion of FIG. 3.
Figure 5:
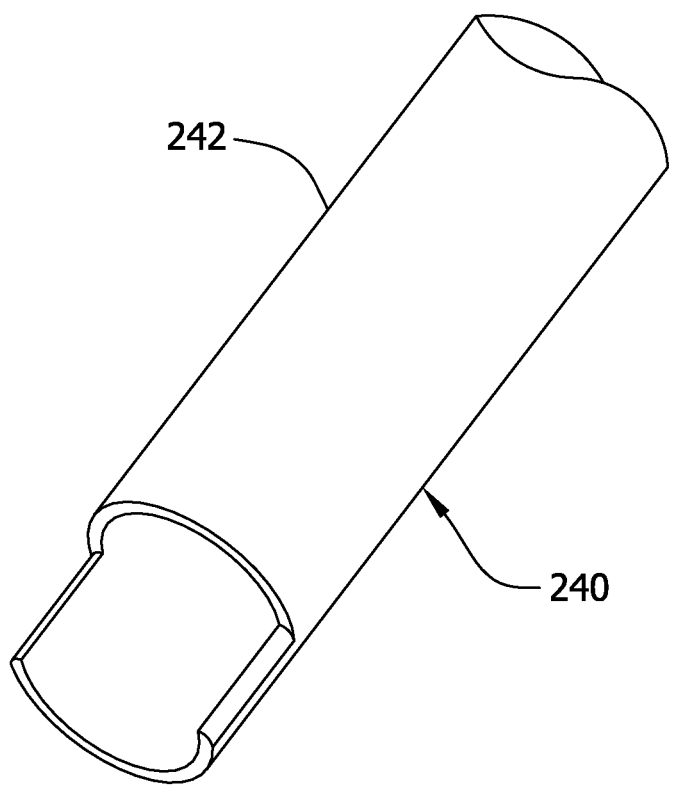
FIG. 5 is perspective view of a portion of an inner conduit.
Figure 6:
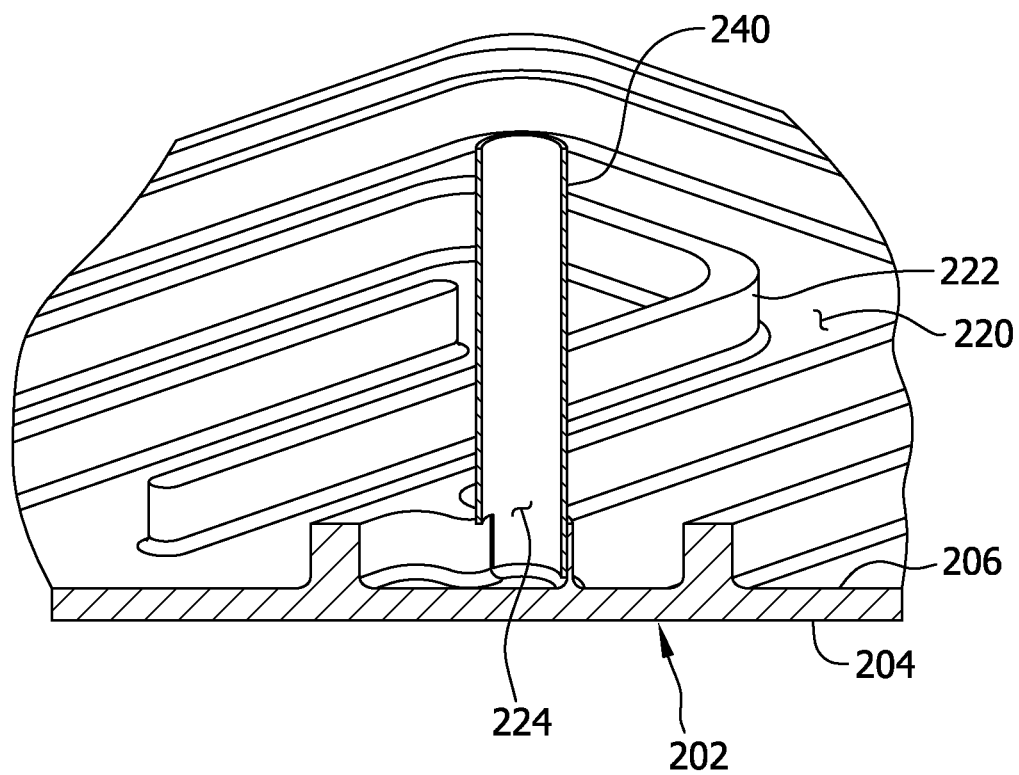
FIG. 6 is a cross-sectional view of the plate of FIG. 3 and the inner conduit of FIG. 51
Figure 7:
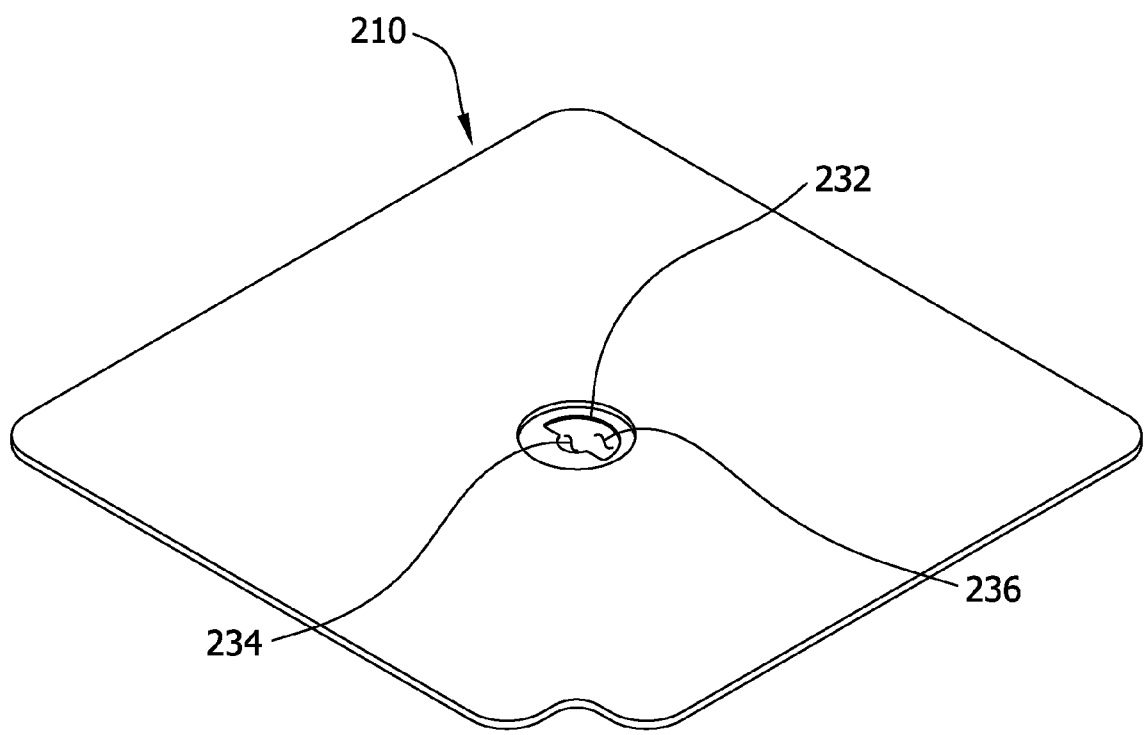
FIG. 7 is perspective view of a cover used in the heat exchanger of FIG. 2.
Figure 8:
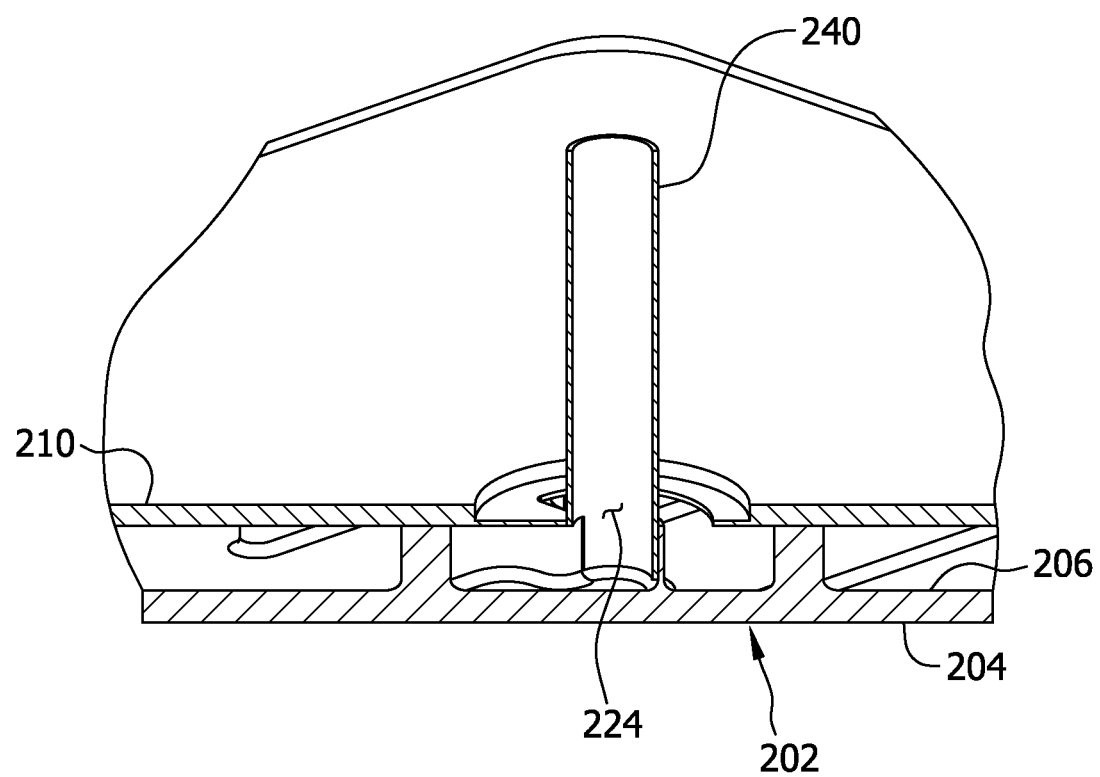
FIG. 8 is a cross-sectional view similar to the FIG. 6 with the cover of FIG. 7 positioned atop the plate.

The heat exchanger 200 is shown in greater detail in FIGS. 2-13 and is inverted from its position in FIG. 1 for the sake of clarity to better show the internal structure of the heat exchanger. As shown in FIG. 3, the heat exchanger 200 includes a plate 202 having an outer surface 204 for positioning proximate the lower surface 116 of the crucible 102. In the example embodiment, the outer surface 204 of the plate 202 is positioned adjacent the bottom 114 of the crucible support 103 and is substantially flat. The heat exchanger 200 is operable to transmit heat away from the lower surface 116 of the crucible 102 and silicon disposed in the crucible to a coolant. In other embodiments where the crucible support 103 is omitted, the outer surface 204 of the plate 202 is positioned adjacent the lower surface 116 of the crucible 102.

The plate 202 has an inner surface 206 opposite the outer surface 204. A cover 210 (FIGS. 2 and 7) is positioned proximate the inner surface 206 of the plate 202 and is connected to the plate with any suitable fastening system (e.g., welding).

As shown in FIG. 3, a circuitous flow path 220 is formed in the plate 202 for directing a flow of coolant along the inner surface 206 of the plate 202. The flow path 220 is defined by a channel including a plurality of members 222 extending from the inner surface 206 of the plate 202 to the cover 210 (the cover is omitted from FIG. 3). The flow path 220 defined by the members 222 is circuitous such that coolant flows along substantially all of the inner surface 206. The members 222 in the example embodiment extend generally perpendicularly from the inner surface 206 to the cover 210. The members 222 extend to adjacent the cover 210 and thus prevent the flow of coolant between the members and the cover. The members 222 thus do not allow coolant to "short-circuit" between adjacent portions of the flow path 220.

The flow path 220 has an inlet 224 for receiving a flow of fresh coolant and an outlet 226 through which coolant exits after it has flowed through the flow path. The inlet 224 and the outlet 226 are positioned adjacent each other. In some embodiments, the inlet 224 and the outlet 226 are coaxial with each other. A wall 230 (FIG. 4) extending from the inner surface 206 to the cover 210 separates the inlet 224 from the outlet 226. The wall 230 also aids in alignment of the other components of the heat exchanger 200. The inlet 224 and the outlet 226 are shown in the example embodiment as being positioned generally at or near a center of the plate 202. In other embodiments, the inlet 224 and the outlet 226 may be positioned differently (e.g., nearer a corner or a side of the plate 202).

The cover 210 (FIG. 7) has an opening 232 formed therein that is in fluid communication with the inlet 224 and the outlet 226 of the flow path 220. The opening 232 is positioned adjacent and/or coaxial both the inlet 224 and the outlet 226. The opening 232 has an inlet portion 234 and a larger outlet portion 236.

An inner conduit 240 (FIGS. 5, 6, and 8) is disposed within the inlet portion 234 of the opening 232 and is connected to the inlet 224 of the flow path 220. An outer conduit 250 (FIG. 13) is connected to the outlet 226 of the flow path 220, as discussed below in greater detail. The term conduit as used herein includes pipes, hoses, tubes, or other structures operable to convey a flow of liquid from one point to another. The inner conduit 240 is connected to the inlet 224 of the flow path 220 and the inner surface 206 of the plate 202 by welding in the example embodiment. In other embodiments, the inner conduit 240 may be connected by any suitable fastening system (e.g., welding or mechanical fasteners).

Figure 9:
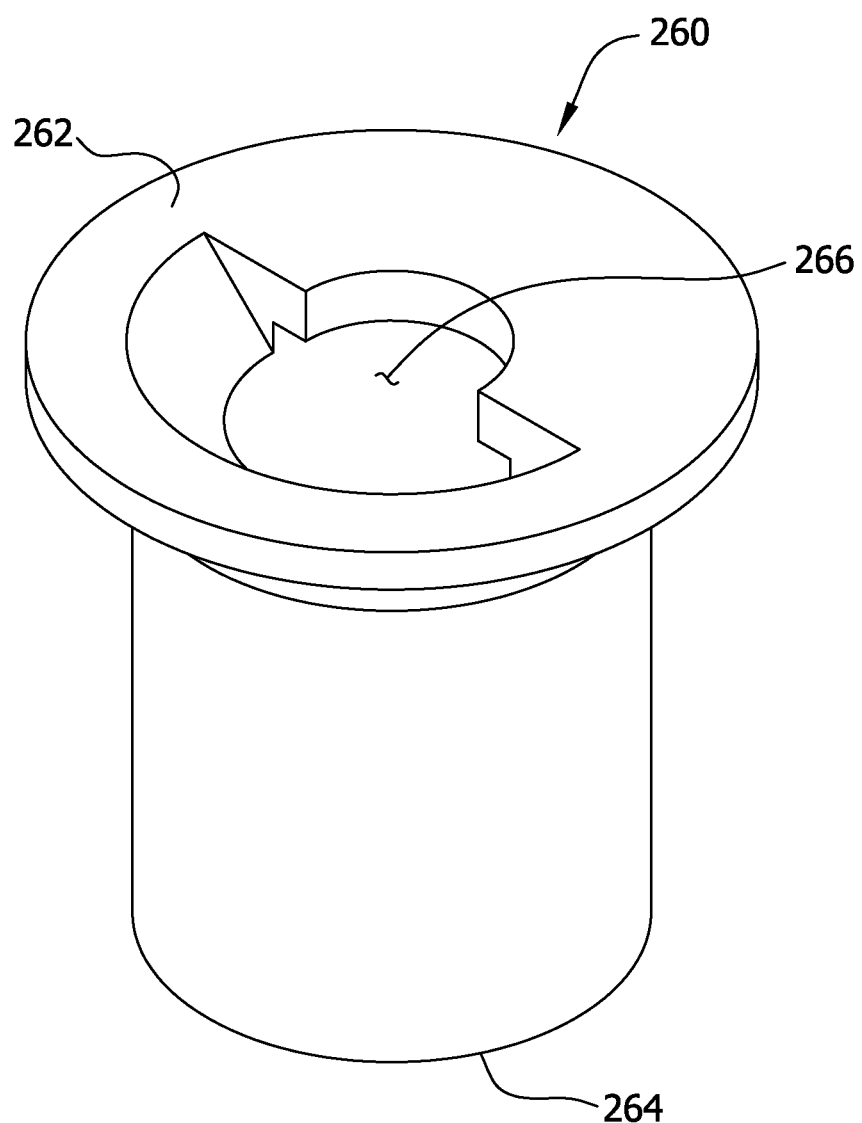
FIG. 9 is a perspective view of a connector.
Figure 10:
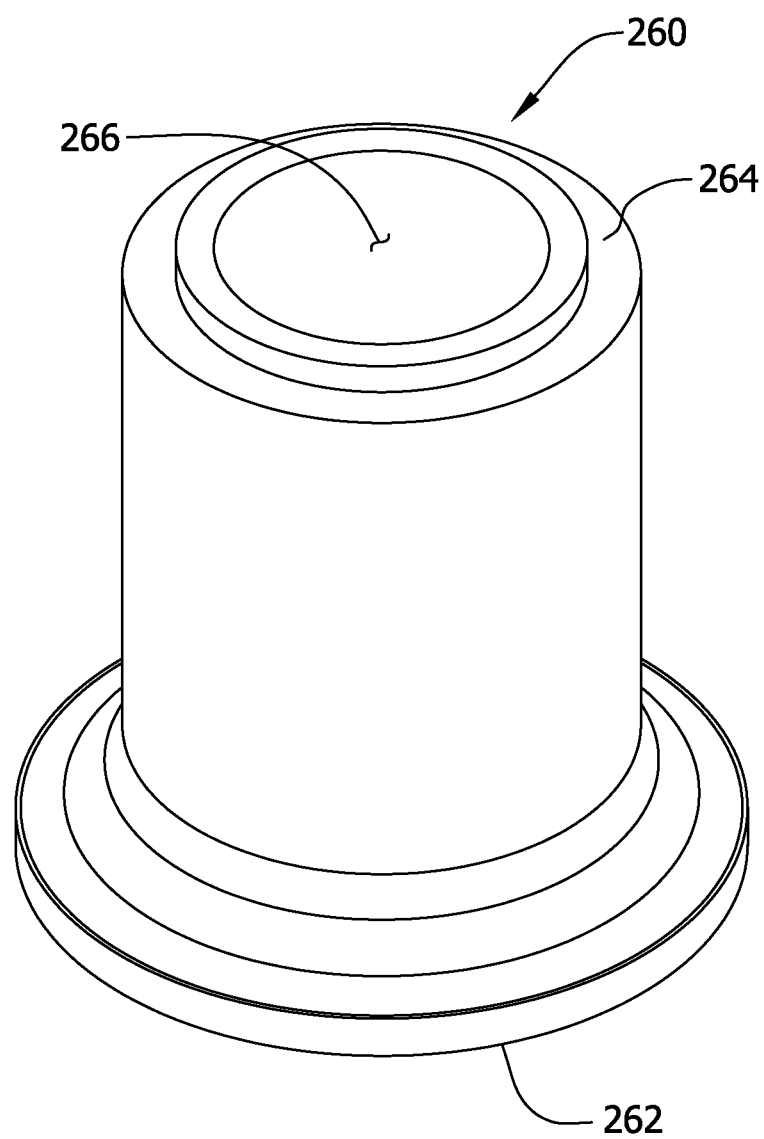
FIG. 10 is a perspective view of the connector of FIG. 9 in an inverted position.
Figure 11:
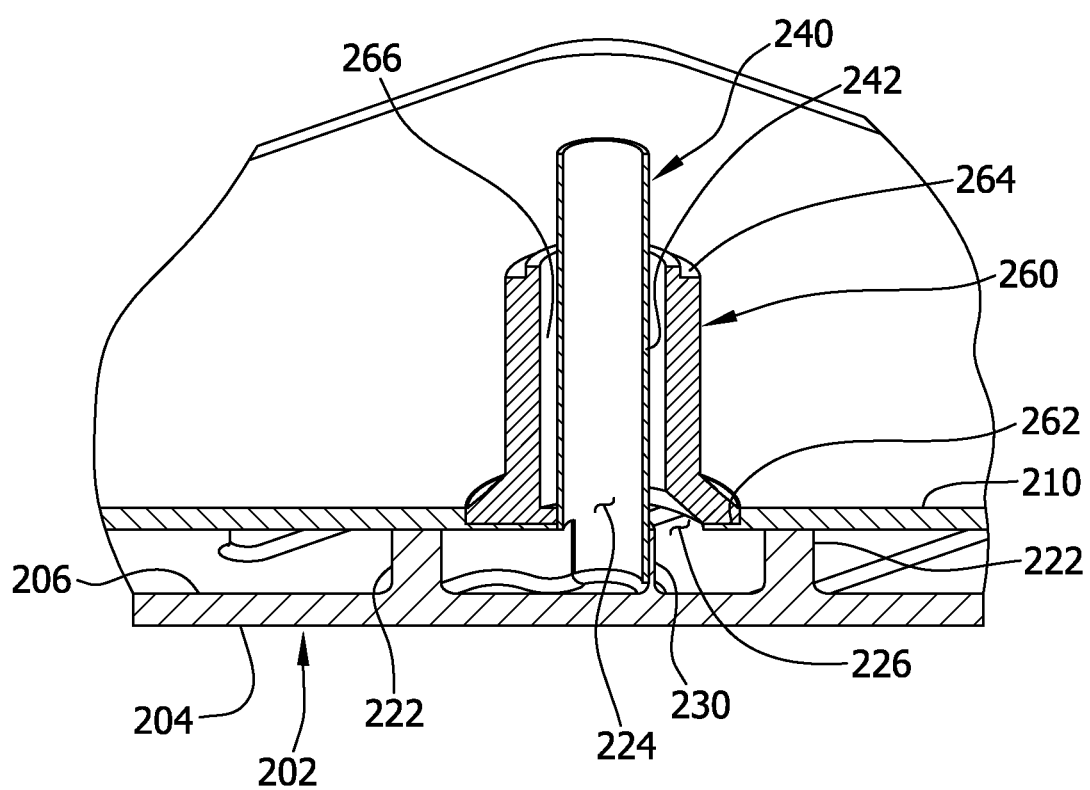
FIG. 11 is a cross-sectional view similar to FIG. 8 with the connector of FIGS. 9 and 10 connected to the connector.
Figure 12:
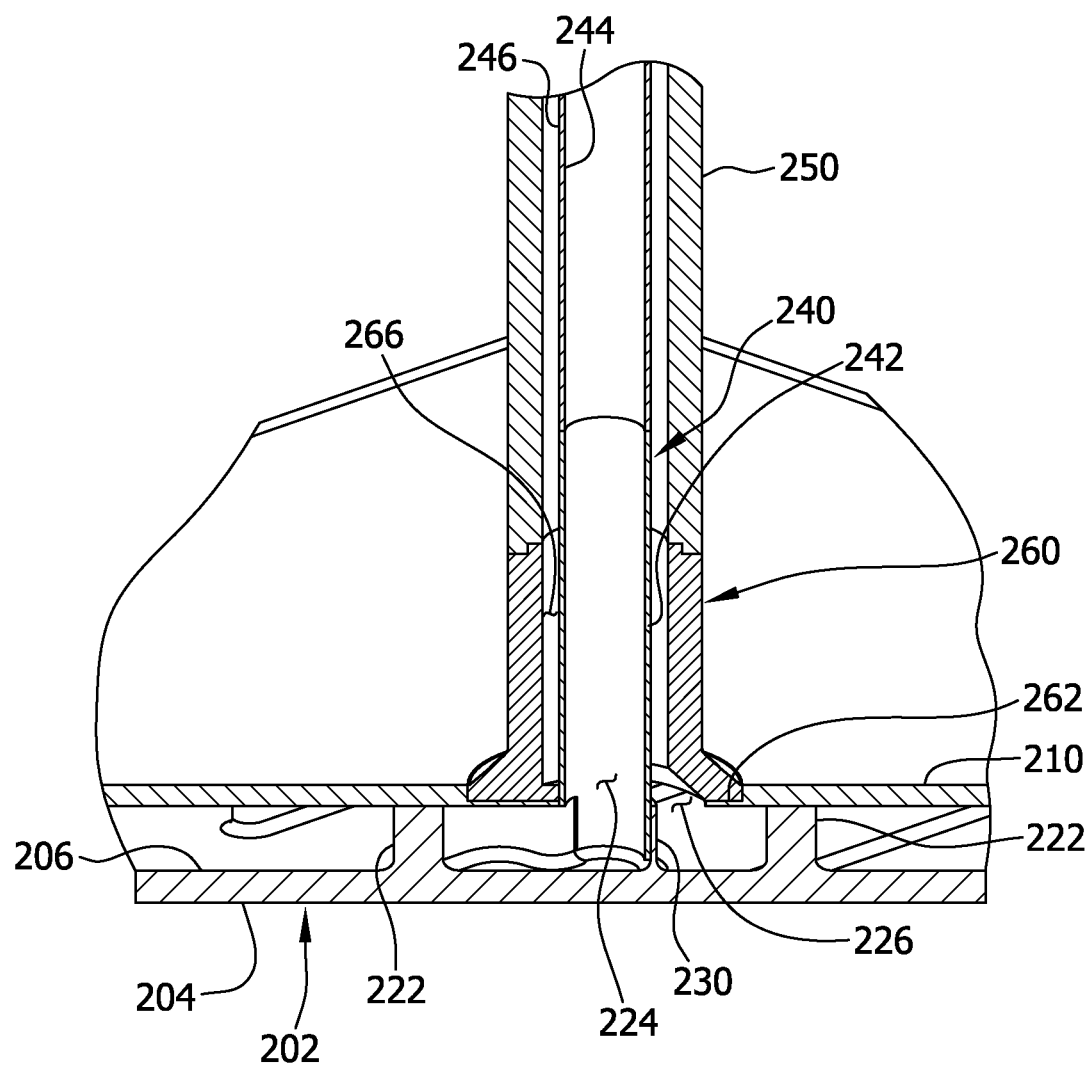
FIG. 12 is a cross-sectional view similar to FIG. 11 with an outer conduit connected to the connector.

The outer conduit 250 is connected to the outlet 226 of the flow path 220 by a connector 260 in the example embodiment. The connector 260, as shown in FIGS. 9 and 10, has an inlet section 262 for connection to the cover 210 and an outlet section 264 for connection to the outer conduit 250. The inlet section 262 of the connector 260 is connected to the cover 210 such that the inlet section is in fluid communication with the outlet 226 of the flow path 220. As shown in FIG. 11, a portion 242 of the inner conduit 240 is disposed within a central opening 266 of the connector 260. In other embodiments the connector 260 is omitted and instead the outer conduit 250 is connected directly to the cover 210 adjacent the outlet portion 236 of the opening 232 in the cover.

Figure 13:
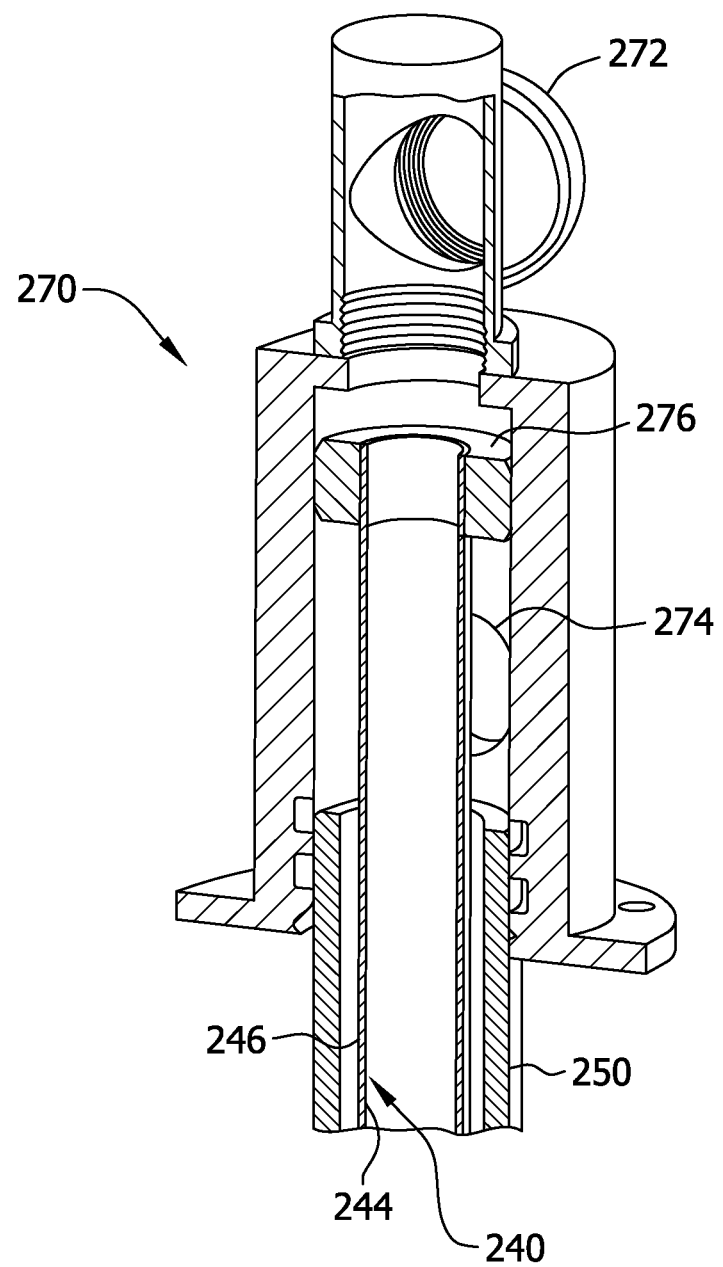
FIG. 13 is a cross-sectional view of the terminal connector of FIG. 2 taken along the 13-13 line.

As shown in FIG. 13, the outer conduit 250 is concentric with the inner conduit 240 and the inner conduit is disposed within the outer conduit. The outer conduit 250 and the inner conduit 240 thus form a multi-lumen conduit structure. In some embodiments, insulation (not shown) may be disposed adjacent the inner conduit 240 to reduce heat transfer from coolant in the outer conduit 250 to coolant in the inner conduit. This insulation can be disposed on either or both of an inner surface 244 or an outer surface 246 of the inner conduit 240. Moreover, all or a portion of the inner conduit 240 may be constructed from a material that has a lower thermal conductivity k compared to that of other components of the heat exchanger 200 to restrict the flow of heat through the inner conduit.

The conduits 240, 250 extend away from the cover 210 of the heat exchanger 200 and end at a terminal connector 270. The terminal connector 270 has an inlet port 272 in fluid communication with the inner conduit 240 and a corresponding outlet port 274 (best seen in FIG. 2) in fluid communication with the outer conduit 250. A gasket-like member 276 disposed within the terminal connector 270 prevents coolant from travelling between the inlet port 272 and the outlet port 274. The inlet port 272 is connected to the source tank 150 with the fluid communication system 170 (shown schematically in FIG. 1). Likewise, the outlet port 274 is connected to the receiving tank 160 with the fluid communication system 170.

In operation and as shown in FIGS. 1-3, fresh coolant is supplied to the inlet port 272 of the terminal connector 270 from the source tank 150. The fresh coolant travels through the inner conduit 240 to the inlet 224 of the flow path 220 in the heat exchanger 220. The fresh coolant then flows through the flow path 220 and heat is transferred from the inner surface 206 of the plate 202 to the coolant. The heat is transferred to the inner surface 206 of the plate 202 from the silicon with the crucible 102. This heat transferred to the coolant causes the temperature of the coolant to increase. After flowing through the flow path 220, the coolant exits the flow path through the outlet 226. At this point, the coolant is referred to as spent coolant. The coolant flows through the outer conduit 250 to the terminal connector 270. The coolant then flows through the outlet port 274 of the terminal connector 270 to the receiving tank 160. The spent coolant may then be cooled by any suitable heat dissipation system that results in a reduction in the temperature of the coolant. The coolant may be transferred to the source tank 150 for subsequent reuse. Alternatively, the spent coolant may be disposed of after flowing from the outlet port 274 of the terminal connector 270.

In the embodiments described herein, fresh coolant is supplied to the inlet 224 of the flow path 220 through the inner conduit 240. In another reverse-flow embodiment, the flow of coolant through the flow path 220 may be reversed, such that fresh coolant is instead supplied to the outlet 226 of the flow path 220 from the outer conduit 250. The spent coolant then exits the flow path 220 though the inlet 224 and into the inner conduit 240. In this reverse-flow embodiment, the outlet port 274 of the terminal connector 270 is connected to the source tank 150 and the inlet port 272 is connected to the receiving tank 160.

The components of the heat exchanger 200 are constructed from suitable materials that are resistant to corrosion. In the example embodiments, such materials include steel, alloys thereof (e.g., stainless steel), aluminum-bronze compounds, or synthetic materials (e.g., hydrocarbon-containing plastics) capable of withstanding elevated temperatures.

The heat exchangers 200 described herein have reduced complexity and increased efficiency compared to prior heat exchangers. As described above, the inner and outer conduits 240, 250 are in a multi-lumen configuration. In prior systems, separate, non-concentric conduits are used to supply and return coolant from heat exchangers. Moreover, such prior systems do not have a flow path with an inlet adjacent to an outlet. Instead, the inlet and the outlet are spaced-apart, resulting in a more complex and larger arrangement occupying more space. This larger arrangement may be even more problematic in the system described above that use four heat exchangers.

Furthermore, the use of prior systems having separate, non-concentric conduits results in the creation of bending moments at the junction of the conduits with the heat exchanger. Such bending moments cause significant stress at the junction that can eventually result in the formation of cracks at the junction due to fatigue. The arrangement of the inner and outer conduits 240, 250 and the connector 260 of the heat exchanger 200 strengthen and stiffen the junction of the conduits and the heat exchanger. Accordingly, the junction is able to withstand greater stresses and is significantly less likely to crack.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A furnace for melting silicon comprising:
   a containment vessel;
   a crucible positioned within the containment vessel, the crucible configured for holding molten silicon, the crucible having a lower surface; and
   a heat exchanger for transferring heat away from the crucible, the heat exchanger comprising:
     a plate having an outer surface for positioning proximate the lower surface of the crucible, an inner surface opposite the outer surface, and a wall extending from the inner surface;
     a flow path formed in the plate for directing a flow of coolant;
     a cover having an opening, wherein the plate and the cover cooperatively define an inlet of the flow path and an outlet of the flow path adjacent the inlet, the opening in fluid communication with the inlet and the outlet, and the wall extending from the inner surface of the plate to the cover and at least partially defining and separating the inlet and the outlet of the flow path;
     an inner conduit in fluid communication with the inlet of the flow path; and
     an outer conduit in fluid communication with the outlet of the flow path, the outer conduit concentric with the inner conduit, at least a portion of the inner conduit disposed within the outer conduit.

2. The furnace of claim 1, wherein the outer conduit is connected to the outlet of the flow path by a connector positioned intermediate the outlet of the flow path and the outer conduit.

3. The furnace of claim 1, wherein the outer conduit is connected directly to the outlet of the flow path.

4. The furnace of claim 1, wherein the flow path is defined by a channel comprising a plurality of members extending from the inner surface to the cover such that the members engage the cover.

5. The furnace of claim 1, wherein the outer surface of the plate is operable to transmit heat away from the lower surface of the crucible and molten silicon disposed in the crucible to the coolant.

6. A heat exchanger system comprising:
   a plate having an outer surface for positioning adjacent a heat source, an inner surface opposite the outer surface, a wall extending from the inner surface, and a flow path formed in the plate for directing a flow of coolant;
   a cover having an opening, wherein the plate and the cover cooperatively define an inlet of the flow path and an outlet of the flow path adjacent the inlet, the opening in fluid communication with the inlet and the outlet, and the wall extending from the inner surface of the plate to the cover and at least partially defining and separating the inlet and the outlet of the flow path;

an inner conduit connected to the inlet of the flow path; and an outer conduit connected in fluid communication with the outlet of the flow path, the outer conduit concentric with the inner conduit.

7. The heat exchanger of claim 6, wherein the flow path is defined by a channel comprising a plurality of members extending from the inner surface to the cover such that the members engage the cover.

8. The heat exchanger of claim 6, wherein the heat source is a portion of a furnace for melting silicon and the outer surface is operable to transmit heat away from the portion of the furnace to the coolant.

9. The heat exchanger of claim 6, wherein the outer surface of the plate is substantially flat.

10. The heat exchanger of claim 6, further comprising a connector connected to the outlet of the flow path, wherein the outer conduit is connected to the outlet by the connector.

11. The heat exchanger of claim 6, wherein at least a portion of the inner conduit is disposed within at least a portion of the outer conduit.

12. A heat transfer plate comprising:

an outer surface for positioning adjacent a heat source;

an inner surface opposite the outer surface;

a plurality of members extending from the inner surface to define a flow path for coolant adjacent the inner surface;

a wall extending from the inner surface, wherein the plate defines an inlet of the flow path and an outlet of the flow path adjacent the inlet, the wall at least partially defining and separating the inlet and the outlet of the flow path; and a cover having an opening in fluid communication with the inlet and the outlet of the flow path, wherein the members extend from the inner surface to the cover such that the members engage the cover.

13. The heat transfer plate of claim 12, wherein the outer surface is operable to transmit heat away from the heat source into the coolant in the flow path.

14. The heat transfer plate of claim 12, further comprising an inner conduit connected to the inlet of the flow path.

15. The heat transfer plate of claim 14, further comprising an outer conduit connected to the outlet of the flow path, the outer conduit concentric with the inner conduit and at least a portion of the inner conduit is disposed within at least a portion of the outer conduit.

16. The heat transfer plate of claim 12, further comprising a connector connected to the outlet of the flow path.

17. The heat transfer plate of claim 16, further comprising an outer conduit connected to the connector, the outer conduit concentric with the inner conduit and at least a portion of the inner conduit is disposed within at least a portion of the outer conduit.

* * * * *